United States Patent
Huang et al.

(10) Patent No.: US 9,536,914 B2
(45) Date of Patent: Jan. 3, 2017

(54) FRONT SIDE ILLUMINATED SEMICONDUCTOR STRUCTURE WITH IMPROVED LIGHT ABSORPTION EFFICIENCY

(71) Applicant: PIXART IMAGING INC., Hsin-Chu County (TW)

(72) Inventors: Sen-Huang Huang, Hsin-Chu County (TW); Huan-Kun Pan, Hsin-Chu County (TW); Yi-Chang Chang, Hsin-Chu County (TW); Ching-Wei Chen, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

(21) Appl. No.: 14/590,270

(22) Filed: Jan. 6, 2015

(65) Prior Publication Data
US 2015/0325616 A1 Nov. 12, 2015

(30) Foreign Application Priority Data

May 12, 2014 (TW) .............................. 103116677 A
Oct. 21, 2014 (TW) .............................. 103136414 A

(51) Int. Cl.
*H01L 31/0232* (2014.01)
*H01L 27/146* (2006.01)

(52) U.S. Cl.
CPC ...... *H01L 27/1462* (2013.01); *H01L 27/14609* (2013.01); *H01L 27/14621* (2013.01); *H01L 27/14627* (2013.01); *H01L 27/14629* (2013.01); *H01L 27/14636* (2013.01); *H01L 27/14643* (2013.01); *H01L 27/14685* (2013.01); *H01L 27/14618* (2013.01)

(58) Field of Classification Search
CPC .................... H01L 27/14629; H01L 27/14643
USPC .......................................... 257/435; 438/22
See application file for complete search history.

(56) References Cited

U.S. PATENT DOCUMENTS

| | | | | |
|---|---|---|---|---|
| 2009/0146234 A1* | 6/2009 | Luo | ................... | H01L 27/14618 257/432 |
| 2014/0374865 A1* | 12/2014 | Kobayashi | ........ | H01L 27/14623 257/435 |
| 2015/0015760 A1* | 1/2015 | Tsunai | ................... | H04N 5/355 348/311 |

* cited by examiner

*Primary Examiner* — Dung Le
(74) *Attorney, Agent, or Firm* — Hauptman Ham, LLP

(57) ABSTRACT

There is provided a front side illuminated (FSI) semiconductor structure with improved light absorption efficiency which is configured to provide a reflecting layer on a bottom of the FSI semiconductor structure to enhance the light absorption efficiency, wherein the reflecting layer is manufactured in the packaging process or the semiconductor process.

10 Claims, 2 Drawing Sheets

FRONT SIDE ILLUMINATED SEMICONDUCTOR STRUCTURE WITH IMPROVED LIGHT ABSORPTION EFFICIENCY

RELATED APPLICATIONS

The present application is based on and claims priority to Taiwanese Application Number 103116677, filed May 12, 2014 and Taiwanese Application Number 103136414, filed Oct. 21, 2014, the disclosure of which is hereby incorporated by reference herein in its entirety.

BACKGROUND

1. Field of the Disclosure

This disclosure generally relates to a semiconductor structure and, more particularly, to a front side illuminated semiconductor structure with improved light absorption efficiency and a manufacturing method thereof.

2. Description of the Related Art

When a conventional front side illuminated semiconductor structure is absorbing light, the light beam not entering light sensing elements or the light beam not being totally absorbed in passing the light sensing elements for the first time is not reused. Accordingly, the conventional front side illuminated semiconductor structure has low light absorption efficiency.

SUMMARY

Accordingly, the present disclosure provides a front side illuminated (FSI) semiconductor structure and a manufacturing method thereof in which a bottom surface of a base layer of the FSI semiconductor structure is processed and a light reflecting layer is then formed on the processed bottom surface of the base layer. The light reflecting layer is configured to reflect the light beam not firstly being absorbed by light sensing elements back to the light sensing elements so as to improve the light absorption efficiency.

The present disclosure provides a front side illuminated semiconductor structure including a transparent layer, a chip structure and a reflecting layer. The transparent layer has an upper surface and a lower surface, wherein the upper surface is configured to receive incident light which penetrates the transparent layer and leaves from the lower surface to form emergent light. The chip structure includes a light sensing region and abase layer, wherein a part of the emergent light sequentially penetrates the light sensing region and the base layer. The reflecting layer is formed on a bottom surface of the base layer and configured to reflect the part of the emergent light back to the light sensing region to be absorbed by the light sensing region again.

The present disclosure further provides a front side illuminated semiconductor structure including a base layer, at least one metal line layer and a reflecting layer. The base layer includes a bottom surface, a top surface and a plurality of photodiodes. The at least one metal line layer is above the top surface of the base layer. The reflecting layer is formed on the bottom surface of the base layer and configured to reflect light, which sequentially penetrates the at least one metal line layer and the base layer, to the photodiodes.

The present disclosure further provides a manufacturing method of a front side illuminated semiconductor structure. The manufacturing method includes the steps of: providing an image sensor chip, wherein the image sensor chip includes a base layer and a plurality of metal line layers, and the base layer includes a light sensing region, a top surface and a bottom surface, and the metal line layers are above the top surface; polishing the bottom surface of the image sensor chip till the base layer is between 2 micrometers and 30 micrometers; and coating a reflecting layer on the polished bottom surface.

In the front side illuminated semiconductor structure according to one embodiment of the present disclosure, the reflecting layer may be manufactured by coating a reflecting layer on a bottom surface of the base layer that is processed by grinding in a packaging process, or by coating a reflecting layer on a bottom surface of the base layer that is processed by chemical mechanical polishing (CMP) in a semiconductor process.

BRIEF DESCRIPTION OF THE DRAWINGS

Applications of the present disclosure will become more apparent from the following detailed descriptions.

DETAILED DESCRIPTION OF THE EMBODIMENT

Figure 1:
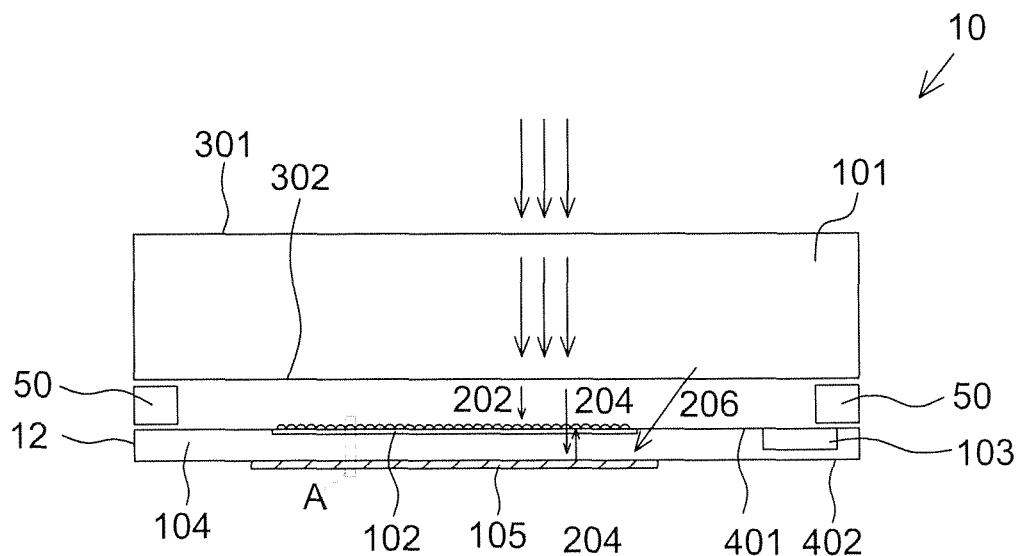
FIG. 1 is a cross sectional view of a front side illuminated semiconductor structure according to one embodiment of the present disclosure.

It should be noted that in the drawings herein elements not directly related to the present disclosure are omitted. Meanwhile, in order to obviously show the relationship between elements, the ratio between elements in the drawings is not necessary to be identical to that between actual elements.

FIG. 1 shows one embodiment of the present disclosure. The front side illuminated semiconductor structure 10 includes a transparent layer 101, a chip structure 12, a light sensing region 102, at least one circuit portion 103, a base layer 104 and a reflecting layer 105, wherein the base layer 104 has a top surface 401 and a bottom surface 402.

Figure 2:
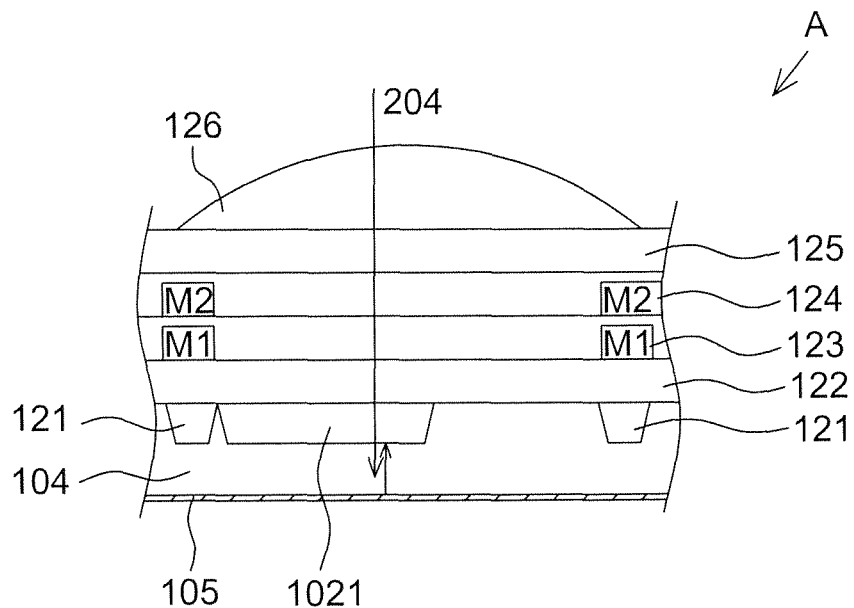
FIG. 2 is a partial enlarged view of the front side illuminated semiconductor structure of FIG. 1.

The chip structure 12 includes the light sensing region 102, the at least one circuit portion 103 and the base layer 104. The light sensing region 102 includes a plurality of photoelectronic devices configured to sense optical energy and generate electrical signals, e.g. including a plurality of photodiodes 1021 (as shown in FIG. 2) arranged in a matrix. The light sensing region 102 is formed in the base layer 104 close to a side of the top surface 401 and configured to sense the light from a direction of the top surface 401 of the base layer 104. The method of forming a plurality of photoelectronic devices in a base layer is well known and thus details thereof are not described herein.

The at least one circuit portion 103 is a control circuit formed in the base layer 104 and configured to control the charge acquisition, reset and charge transferring of the light sensing region 102. More specifically, the at least one circuit portion 103 may include a plurality of transistors configured to control the charge acquisition, reset and charge transferring of the photodiodes 1021. In some embodiments, the circuit portion 103 may directly perform the post-processing of image signals according to different applications.

The position relationship between elements is illustrated below in conjunction with the accompanying drawings so as to better understand the effect of the present disclosure.

The transparent layer 101 has an upper surface 301 and a lower surface 302, wherein the upper surface 30 is configured to receive incident light. After penetrating the transparent layer 101, the incident light leaves from the lower surface 302 so as to form emergent light to reach the chip structure 12. In the present disclosure, the light sensing element 1021 included in the chip structure 12 is the only element arranged for efficiently absorbing light. Generally, the light which penetrates the transparent layer 101 (i.e. the emergent light) and directly impinges on the light sensing element 1021, e.g. the light beam 202, is directly absorbed by the light sensing element 1021. However, actually some emergent light is wasted, such as the light beam 204 which indicates the light reaching the light sensing element 1021 but not totally being absorbed, and a part of the emergent light penetrates the light sensing region 102 and the base layer 104. In addition, another part of light, such as the light beam 206 which does not reach the light sensing element 1021, is not absorbed by the light sensing element 206 at all.

In the present disclosure, the base layer 104 has a bottom surface 402 which is surface processed. After the surface processing, a reflecting layer 105 is formed on the bottom surface 402. Accordingly, when a part of the emergent light which is not absorbed in the first penetration reaches the reflecting layer 105, the part of the emergent light is reflected back to the light sensing region 102 by the reflecting layer 105 to allow the light sensing region 102 to absorb the reflected emergent light again. For example, the light beam 204 shown in FIG. 1 is reflected by the reflecting layer 105 to be absorbed by the light sensing region 102 again so as to increase the light absorption efficiency.

It should be noted that said light beams 202 and 204 are only intended to illustration the effect of the present disclosure. Actually, the light has various propagation directions, and the arrangement of the reflecting layer 105 in the present disclosure may allow the light sensing region 102 to effectively absorb the light penetrating the transparent layer 101.

Said surface processing of the base layer 104 may be implemented by polishing the bottom surface 402 of the base layer 104, e.g. using the chemical mechanical polishing (CMP) in a semiconductor process or the grinding in a chip-scale packaging process, but not limited thereto. One object of the polishing is to form the bottom surface 402 of the base layer 104 as a smooth surface such that when the reflecting layer 105 is formed in the followed processes, the reflecting layer 105 may effectively reflect the light back, wherein the material of the reflecting layer 105 does not have particular limitations as long as the absorption spectrum of the light sensing region 102 is reflected thereby. When the surface of the base layer 104 is processed by polishing, a thickness of the base layer 104 is maintained within several to dozens of micrometers. Preferably, the thickness of the base layer 104 is between 2 micrometers and 30 micrometers.

In order to reflect the light which is not absorbed in the first penetration back to the light sensing region 102, the reflecting layer 105 is arranged below the light sensing region 102 and has an area at least substantially identical to that of the light sensing region 102. In considering of multi-directions of the light propagation, preferably the area occupied by the reflecting layer 105 is larger than and covering the area occupied by the light sensing region 102 (or the photodiodes 1021).

In other embodiments, if the light sensing region 102 has high absorption ability, the reflecting layer 105 may only be formed corresponding to a periphery of the light sensing region 102 and extending outwardly. In one embodiment, the refection layer 105 is formed as a ring shape such that a center part of the light sensing region 102 (or the photodiodes 1021) does not opposite to the reflecting layer 105. Accordingly, only the light penetrating the periphery of the light sensing region 102 and not directly passing through the light sensing region 102 is reflected by the ring-shaped reflecting layer 105.

The material of said transparent layer 101 is selected to allow the target color of light to pass through. For example, for the product of absorbing visible light, the material transparent to visible light is selected to allow the visible light to pass through, e.g. the glass. For example, for the product of absorbing invisible light, e.g. infrared light, the material opaque to visible light but transparent to infrared light is selected. The transparent layer 101 may be combined with a filter layer but this is not an object of the present disclosure. Other possible modifications and variations may be made by those skilled in the art without departing from the spirit and scope of the disclosure.

Said transparent layer 101 may be combined with lenses, or the function of lenses may be formed with the upper surface and/or the lower surface thereof to allow the light to enter in a better direction for being absorbed by the light sensing elements 1021. In addition, a surface of the light sensing region 102 may also be processed to have the function of the filter or lens, e.g. forming micro-lenses on the surface of the light sensing region 102 through a semiconductor process.

Referring to FIG. 2, it is an enlarged view of a part A of the chip structure 12 of FIG. 1, wherein the chip structure 12 includes the base layer 104, a light sensing element 1021, a dielectric layer 122 formed upon the base layer 104, a first metal line layer 123, a second metal line layer 124, a filter layer 125 and a microlens 126, wherein the first metal line layer 123 and the second metal line layer 124 are formed above the base layer 104 but preferably not above the light sensing element 1021 so as not to block the entrance of light. It should be mentioned that a layer number of the metal line layers shown in FIG. 2 is only intended to illustrate but not to limit the present disclosure.

In some embodiments, the filter layer 125 may not be implemented, e.g. a filter layer already being formed with the transparent layer 101. The filter layer 125 is configured to limit the light spectrum reaching the light sensing element 1021 such that the filter layer 125 is preferably arranged to correspond to the light sensing element 1021. The microlens 126 is configured to improve the light sensing efficiency of the light sensing element 1021 such that the microlens 126 is preferable arranged to correspond to the light sensing element 1021.

It is appreciated that FIG. 2 shows a partial cross sectional view of one light sensing element 1021 of the chip structure 12. In the present disclosure, the chip structure 12 includes a plurality of filter layers 125 and/or a plurality of microlenses 126 corresponding to the light sensing region 102. In addition, the chip structure 12 may include a plurality of isolation grooves configured to isolate adjacent light sensing elements 1021.

In this embodiment, the chip structure 12 may be a front side illuminated image sensor chip such that the light beam 204 sequentially penetrates the second metal line layer 124, the first metal line layer 123, the dielectric layer 122 and the base layer 104 and then reaches the reflecting layer 105, and the reflecting layer 105 then reflects the light beam 204 back to the light sensing element 1021. More specifically, in this embodiment the first metal line layer 123 and the second metal line layer 124 are at a side of the base layer 104 different from that of the reflecting layer 105.

The lower surface of said transparent layer 101 may have a predetermined distance from the surface of the light sensing region 102 to prevent the transparent layer 101 from contacting or pressing on the light sensing elements 1021 to cause damages. In this manner, a raised structure may be disposed between the transparent layer 101 and the chip structure 12 to be served as a spacer 50 thereby maintaining a predetermined distance between the transparent layer 101 and the chip structure 12. Furthermore, the raised structure may be formed integrally in manufacturing the transparent layer 10 or at a suitable position(s) on the surface of the chip structure 12 such that when the transparent layer 101 is disposed upon the chip structure 12, a proper distance is kept between the transparent layer 101 and the chip structure 12.

Figure 3:
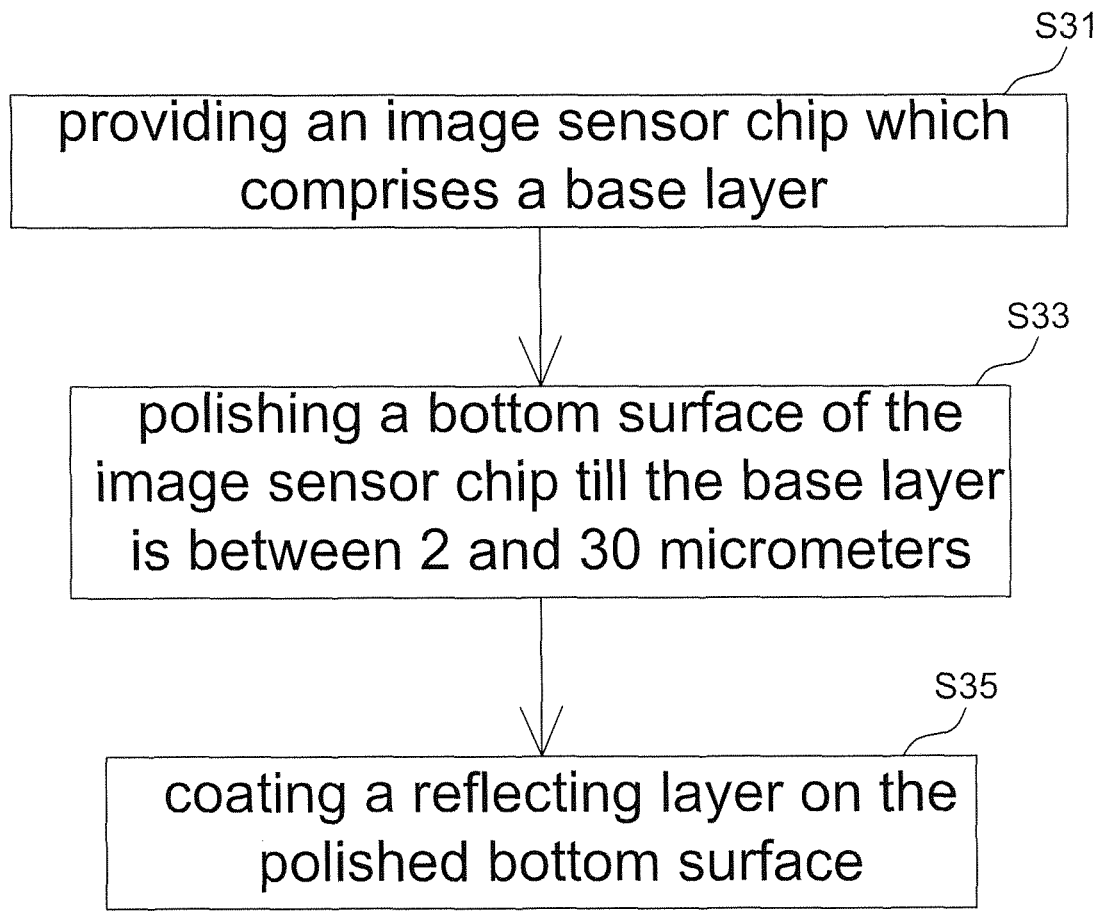
FIG. 3 is flow chart of a manufacturing method of a front side illuminated semiconductor structure according to one embodiment of the present disclosure.

Referring to FIG. 3, it is a flow chart of a manufacturing method of a front side illuminated semiconductor structure according to one embodiment of the present disclosure, which includes the steps of: providing an image sensor chip (Step S31); polishing a bottom surface of the image sensor chip till a base layer is between 2 micrometers and 30 micrometers (Step S33); coating a reflecting layer on the polished bottom surface (Step S35), wherein the image sensor chip 12 includes a base layer 104 and a plurality of metal line layers (e.g. the first metal line layer 123 and the second metal line layer 124 in FIG. 2). The base layer 104 includes a light sensing region 102, atop surface 401 and a bottom surface 402, and the metal line layers are arranged above the top surface 401. As this embodiment provides a front side illuminated structure, after sequentially passing through the metal line layers and the base layer 104, the light is then reflected by the reflecting layer 105. As mentioned above, the reflecting layer 105 may be formed on the polished bottom surface of the base layer 104 by coating, sputtering or other suitable methods in a packaging process or a semiconductor process. In addition, this embodiment may further include the step of forming a plurality of filter layers 125 and/or a plurality of microlenses above the top surface 401 and corresponding to the light sensing region 102.

As mentioned above, in the conventional front side illuminated semiconductor structure a part of incident light may not be absorbed by light sensing elements. Therefore, the present disclosure further provides a front side illuminated semiconductor structure (FIGS. 1-2) and a manufacturing method thereof (FIG. 3) in which a reflecting layer is formed on a bottom surface of a base layer so as to reflect the residual light beam not being absorbed by light sensing elements back to the light sensing elements thereby improving the light absorption efficiency.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A front side illuminated semiconductor structure comprising:
    a transparent layer having an upper surface and a lower surface, wherein the upper surface is configured to receive incident light which penetrates the transparent layer and leaves from the lower surface to form emergent light;
    a chip structure comprising a light sensing region and a base layer, wherein a part of the emergent light sequentially penetrates the light sensing region and the base layer; and
    a reflecting layer formed on a bottom surface of the base layer and directly in contact with the base layer, and configured to reflect the part of the emergent light back to the light sensing region to be absorbed by the light sensing region again.

2. The front side illuminated semiconductor structure as claimed in claim 1, wherein at least one spacer is disposed between the transparent layer and the chip structure configured to maintain a predetermined distance.

3. The front side illuminated semiconductor structure as claimed in claim 1, wherein the chip structure is a front side illuminated image sensor chip.

4. The front side illuminated semiconductor structure as claimed in claim 1, further comprising a plurality of metal line layers, and the metal line layers and the reflecting layer are respectively at different sides of the base layer.

5. The front side illuminated semiconductor structure as claimed in claim 1, wherein the chip structure further comprises a control circuit configured to control charge acquisition, reset and charge transferring of the light sensing region.

6. The front side illuminated semiconductor structure as claimed in claim 1, wherein the chip structure further comprises a plurality of filter layers and/or a plurality of microlenses corresponding to the light sensing region.

7. The front side illuminated semiconductor structure as claimed in claim 1, wherein a thickness of the base layer is between 2 micrometers and 30 micrometers.

8. The front side illuminated semiconductor structure as claimed in claim 1, wherein an area of the reflecting layer is larger than that of the light sensing region.

9. The front side illuminated semiconductor structure as claimed in claim 1, wherein the light sensing region comprises a plurality of photodiodes.

10. A front side illuminated semiconductor structure comprising:
    a transparent layer having an upper surface and a lower surface, wherein the upper surface is configured to receive incident light which penetrates the transparent layer and leaves from the lower surface to form emergent light;
    a chip structure comprising a light sensing region and a base layer, wherein a part of the emergent light sequentially penetrates the light sensing region and the base layer, and the transparent layer is mounted on a surface of the chip structure; and
    a reflecting layer formed on a bottom surface of the base layer and configured to reflect the part of the emergent light back to the light sensing region to be absorbed by the light sensing region again.

* * * * *